(12) United States Patent
Al Eid et al.

(10) Patent No.: US 11,891,705 B2
(45) Date of Patent: Feb. 6, 2024

(54) REFERENCE ELECTRODE SYSTEMS AND METHODS FOR DETERMINING CATHODIC PROTECTION

(71) Applicant: Saudi Arabian Oil Company, Dhahran (SA)

(72) Inventors: Ahmed Al Eid, Udhailiyah (SA); Abdullah Al Zahami, Udhailiyah (SA)

(73) Assignee: Saudi Arabian Oil Company, Dhahran (SA)

( * ) Notice: Subject to any disclaimer, the term of this patent is extended or adjusted under 35 U.S.C. 154(b) by 526 days.

(21) Appl. No.: 17/140,244

(22) Filed: Jan. 4, 2021

(65) Prior Publication Data
US 2022/0213603 A1 Jul. 7, 2022

(51) Int. Cl.
*C23F 13/22* (2006.01)
*G01R 29/00* (2006.01)
*C23F 13/10* (2006.01)

(52) U.S. Cl.
CPC .............. *C23F 13/22* (2013.01); *C23F 13/10* (2013.01); *G01R 29/00* (2013.01)

(58) Field of Classification Search
CPC ....... G01F 23/266; G01F 23/24; G01F 23/804
See application file for complete search history.

(56) References Cited

U.S. PATENT DOCUMENTS

| 5,172,332 A * | 12/1992 | Hungerford .......... G01F 23/296 700/267 |
| 5,305,631 A * | 4/1994 | Whited ................... C23F 13/02 220/565 |
| 5,596,267 A * | 1/1997 | Lara ....................... G01N 17/02 204/402 |
| 2007/0006646 A1 * | 1/2007 | Vargas Da Silva ..... G01F 23/24 73/304 R |
| 2011/0110792 A1 * | 5/2011 | Mauro .................... F04D 13/08 73/304 C |
| 2014/0062490 A1 | 3/2014 | Neuman et al. |
| 2017/0067736 A1 * | 3/2017 | Silverman ............ G01N 27/021 |

OTHER PUBLICATIONS

McMiller Co., "Sponge Bottle Electrode—Coper/Copper Sulfate Version (CAT #15625)", Accessed Oct. 21, 2020.

* cited by examiner

*Primary Examiner* — Jermele M Hollington
*Assistant Examiner* — Temilade S Rhodes-Vivour
(74) *Attorney, Agent, or Firm* — DINSMORE & SHOHL LLP

(57) ABSTRACT

A reference electrode assembly including an extension device having a first end opposite a second end and a fluid reservoir disposed between the first end and the second end, a reference electrode engageable with the extension device at the first end of the extension device, an end cap having an external electrical connector positioned at the second end of the extension device, a selectively actuatable spout fluidly coupled to the fluid reservoir, and a conductive wire extending through the fluid reservoir to electrically couple the reference electrode with the external electrical connector.

5 Claims, 4 Drawing Sheets ated by the external environment. In cathodic protection, the metal structure of interest, which it is desirable to reduce the corrosion of, is made to be the cathode in an electrochemical cell, and a second metal is used as the anode. In passive cathodic protection systems, the anode, or sacrificial metal, is generally a more active (or more electrically negative) metal than the protected metal structure. The anode and cathode are placed in a shared electrolyte, such as the earth's subsurface, and the more active anode donates electrons to the cathode, causing the anode to corrode, and in turn protecting the cathode from corroding. In impressed current cathodic protection systems, a direct current power source is connected between the anode and the cathode. The power source drives a flow of current from the anode to the cathode. In such systems, the anode may not donate any of its own electrons to the cathode, and therefore, the corrosion of both the cathode and the anode may be reduced or eliminated. In both passive and impressed current cathodic protection systems, the systems are periodically tested to determine the polarization of the protected metal structure and ensure that the metal structure is not undesirably corroding. For larger metal structures, the polarization of the metal structure is often tested at various points along the entire length of the structure.

REFERENCE ELECTRODE SYSTEMS AND METHODS FOR DETERMINING CATHODIC PROTECTION

TECHNICAL FIELD

The present specification generally relates to reference electrode assemblies and, more particularly, to reference electrode assemblies including fluid reservoirs for directing an amount of fluid to a ground surface or subsurface of a test site where the cathodic protection of a metal structure is determined.

BACKGROUND

Metal structures, particularly structures that are designed to be permanent or semi-permanent (i.e. installed or in use until failure), such as pipelines, bridges, and storage tanks, are exposed to the external environment for large periods of time. Exposure to the external environment (e.g. air, water, and/or the earth's subsurface) is liable to oxidize and corrode the metal structure over time. This is even true in cases where the metal structure is coated in an oxide layer or other corrosion-resistant coating. Corrosion of these metal structures may result in safety concerns, as the corrosion may reduce the structural integrity of the metal structure and eventually result in mechanical failure. Accordingly, corroding metal structures should be repaired or replaced prior to the corrosion deteriorating the mechanical strength of the metal structure. However, it should be appreciated that depending on the size and placement of the metal structures, the repairment or replacement of the structures may require significant financial investment.

Cathodic protection is one known technique for reducing the corrosion of metal structures exposed to the external environment. In cathodic protection, the metal structure of interest, which it is desirable to reduce the corrosion of, is made to be the cathode in an electrochemical cell, and a second metal is used as the anode. In passive cathodic protection systems, the anode, or sacrificial metal, is generally a more active (or more electrically negative) metal than the protected metal structure. The anode and cathode are placed in a shared electrolyte, such as the earth's subsurface, and the more active anode donates electrons to the cathode, causing the anode to corrode, and in turn protecting the cathode from corroding. In impressed current cathodic protection systems, a direct current power source is connected between the anode and the cathode. The power source drives a flow of current from the anode to the cathode. In such systems, the anode may not donate any of its own electrons to the cathode, and therefore, the corrosion of both the cathode and the anode may be reduced or eliminated. In both passive and impressed current cathodic protection systems, the systems are periodically tested to determine the polarization of the protected metal structure and ensure that the metal structure is not undesirably corroding. For larger metal structures, the polarization of the metal structure is often tested at various points along the entire length of the structure.

Accordingly, a need exists for alternative devices and methods for assessing the polarization of metal structures acting as the cathode of cathodic protection systems that reduces testing time and physical strain on technicians.

SUMMARY

According to an embodiment of the present disclosure, a reference electrode assembly includes an extension device having a first end opposite a second end and a fluid reservoir disposed between the first end and the second end. The reference electrode assembly further includes a reference electrode engageable with the extension device at the first end of the extension device, an end cap having an external electrical connector positioned at the second end of the extension device, and a selectively actuatable spout fluidly coupled to the fluid reservoir. The reference electrode assembly further includes a conductive wire extending through the fluid reservoir to electrically couple the reference electrode with the external electrical connector.

In another embodiment, a method includes contacting at least a portion of a reference electrode of a reference electrode assembly with a ground surface at a test site. The reference electrode assembly includes an extension device having a first end opposite a second end, where the first end is engageable with the reference electrode, and a fluid reservoir is disposed between the first end and the second end. The reference electrode assembly further includes the reference electrode engageable with the extension device at the first end of the extension device, an end cap having an external electrical connector positioned at the second end of the extension device, and a selectively actuatable spout fluidly coupled to the fluid reservoir. The reference electrode assembly further includes a conductive wire extending through the fluid reservoir to electrically couple the reference electrode with the external electrical connector. The method also includes actuating the selectively actuatable spout to direct an amount of fluid from the fluid reservoir to the ground surface at the test site, electrically coupling the reference electrode to a first terminal of a voltmeter, electrically coupling a first portion of a metal structure to a second terminal of the voltmeter, determining the polarization of the first portion of the metal structure.

In yet another embodiment, a reference electrode assembly includes an extension device having a first end opposite a second end and a fluid reservoir disposed between the first end and the second end. The reference electrode assembly further includes a reference electrode engageable with the extension device at the first end of the extension device, an end cap having an external electrical connector positioned at the second end of the extension device, a selectively actuatable spout fluidly coupled to the fluid reservoir, and an opening in an outer surface of the extension device disposed between the selectively actuatable spout and the second end of the extension device. The opening is fluidly coupled to the fluid reservoir, and a plug is engageable with the opening. The reference electrode assembly further includes a conductive fitting disposed between the reference electrode and the fluid reservoir, a first sealant disposed between the conductive fitting and the fluid reservoir, and a second sealant disposed between the end cap and the fluid reservoir. The reference electrode assembly further includes a conductive wire extending through the fluid reservoir and at least partially through the first and second sealants to electrically couple the reference electrode with the external electrical connector.

Additional features and advantages of the systems and methods described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an over-view or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
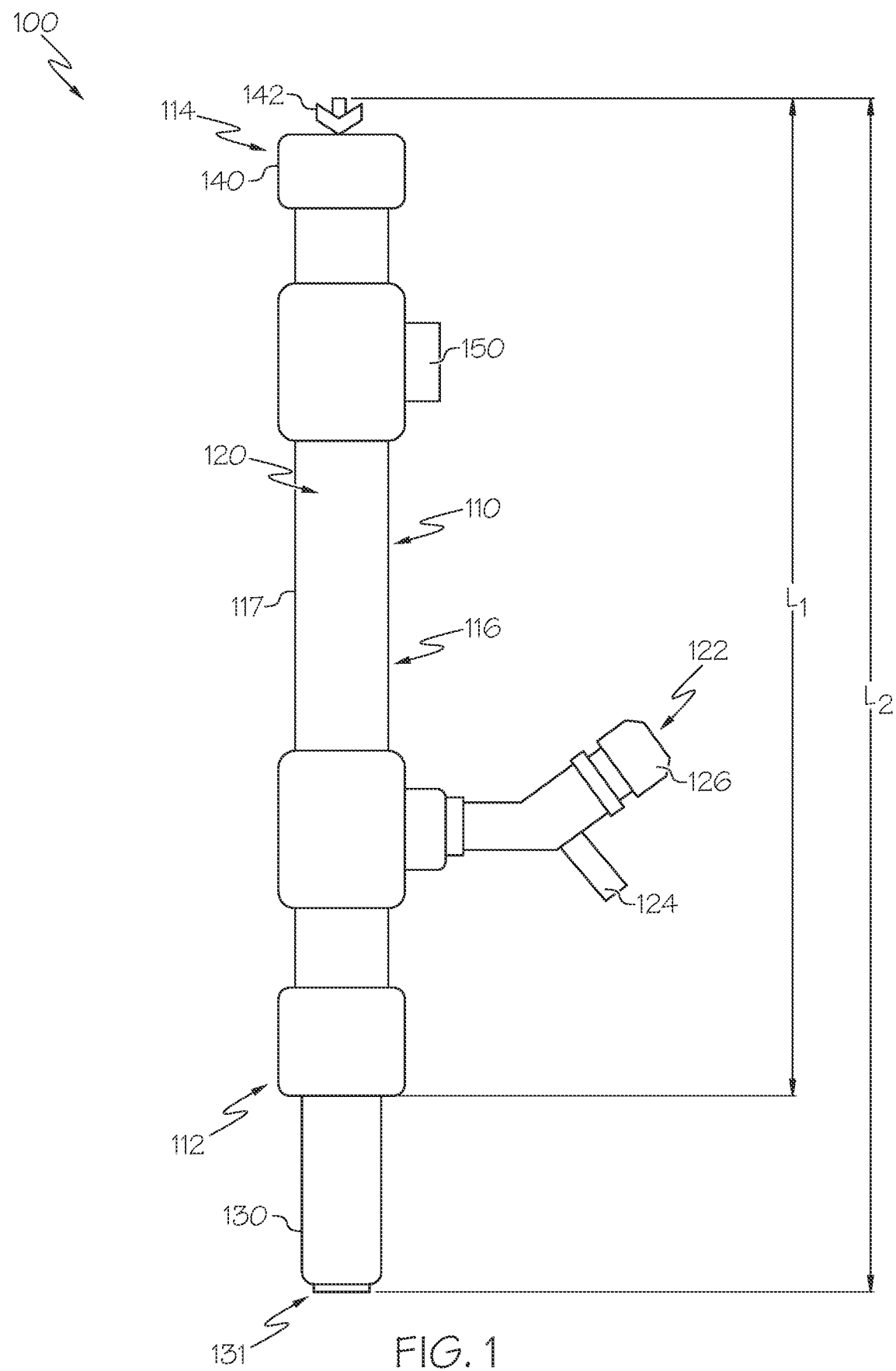
FIG. 1 schematically depicts a side view of a reference electrode assembly, according to one or more embodiments described herein.

Reference will now be made in detail to embodiments of reference electrode assemblies and methods of operating the same, examples of which are illustrated in the accompanying drawings. Embodiments described herein are directed to a reference electrode assembly comprising an extension device having a first end opposite a second end and a fluid reservoir disposed between the first end and the second end. The reference electrode assembly further includes a reference electrode engageable with the extension device at the first end of the extension device, an end cap having an external electrical connector positioned at the second end of the extension device, and a selectively actuatable spout fluidly coupled to the fluid reservoir. The reference electrode assembly further includes a conductive wire extending through the fluid reservoir to electrically couple the reference electrode with the external electrical connector. Various embodiments of reference electrode assemblies and methods for operating the same will be described herein with specific reference to the appended drawings.

Reference electrodes may be used to periodically determine the polarization, or test the cathodic protection, of a metal structure that is protected from corrosion by either passive or impressed current cathodic protection systems. More particularly, reference electrodes may be used to determine the polarization of protected metal structures that are at least partially buried beneath, or in contact with, a ground surface. In conventional testing procedures, a reference electrode may be placed in contact with the ground surface and/or subsurface at a plurality of test sites along the length of the metal structure and used to measure the difference in potential between the metal structure and the subsurface and/or ground surface surrounding the metal structure at each test site. More particularly, when testing the cathodic protection of a lengthy metal structure, such as a pipe line, technicians determine the polarization of the metal structure at roughly 140 to 175 different test sites that span a total distance of 12 to 15 km along the metal structure. However, such conventional testing procedures have several shortcomings. For instance, at each test site, a technician may have to bend over or sit to contact the reference electrode with, or insert the reference electrode in, the ground surface, maintain the reference electrode in contact with the ground surface, and electrically connect a voltmeter to the reference electrode. Accordingly, conventional testing procedures lack in ergonomics, requiring technicians to repeatedly contort their bodies at the possible risk of strain and injury. Moreover, to ensure accurate voltmeter readings concerning the difference in potential between the metal structure and the subsurface and/or ground surface surrounding the metal structure, contact resistance between the reference electrode and the surface and/or subsurface surrounding the reference electrode should be minimized. To reduce this contact resistance, technicians carry a separate container of water with them across the 12 to 15 km of metal structure covered during a regular daily testing routine and pour a small amount of water on the ground surface surrounding the reference electrode. The use of the separate water container increases the number of instruments technicians must carry between the multiple test sites and increases the time and number of steps required at each test site, as it is unwieldy for a technician to simultaneously handle the reference electrode and the water container.

The embodiments described herein address one or more of the aforementioned issues with conventional testing procedures. In particular, the reference electrode assemblies described herein include a reference electrode extension device that reduces the need for technicians to repeatedly bend over to operate the reference electrode at each test site along the cathodically protected metal structure. Moreover, the reference electrode assemblies include a water reservoir, negating the need for technicians to carry a separate water container to each test site. Accordingly, the reference electrode assemblies described herein benefit both the ergonomics and efficiency of testing procedures. The reference electrode assemblies described herein reduce the potential for physical wear and injury of technicians and enable technicians to cover an equal number of test locations over an equal distance of a cathodically protected metal structure in less time.

Figure 2:
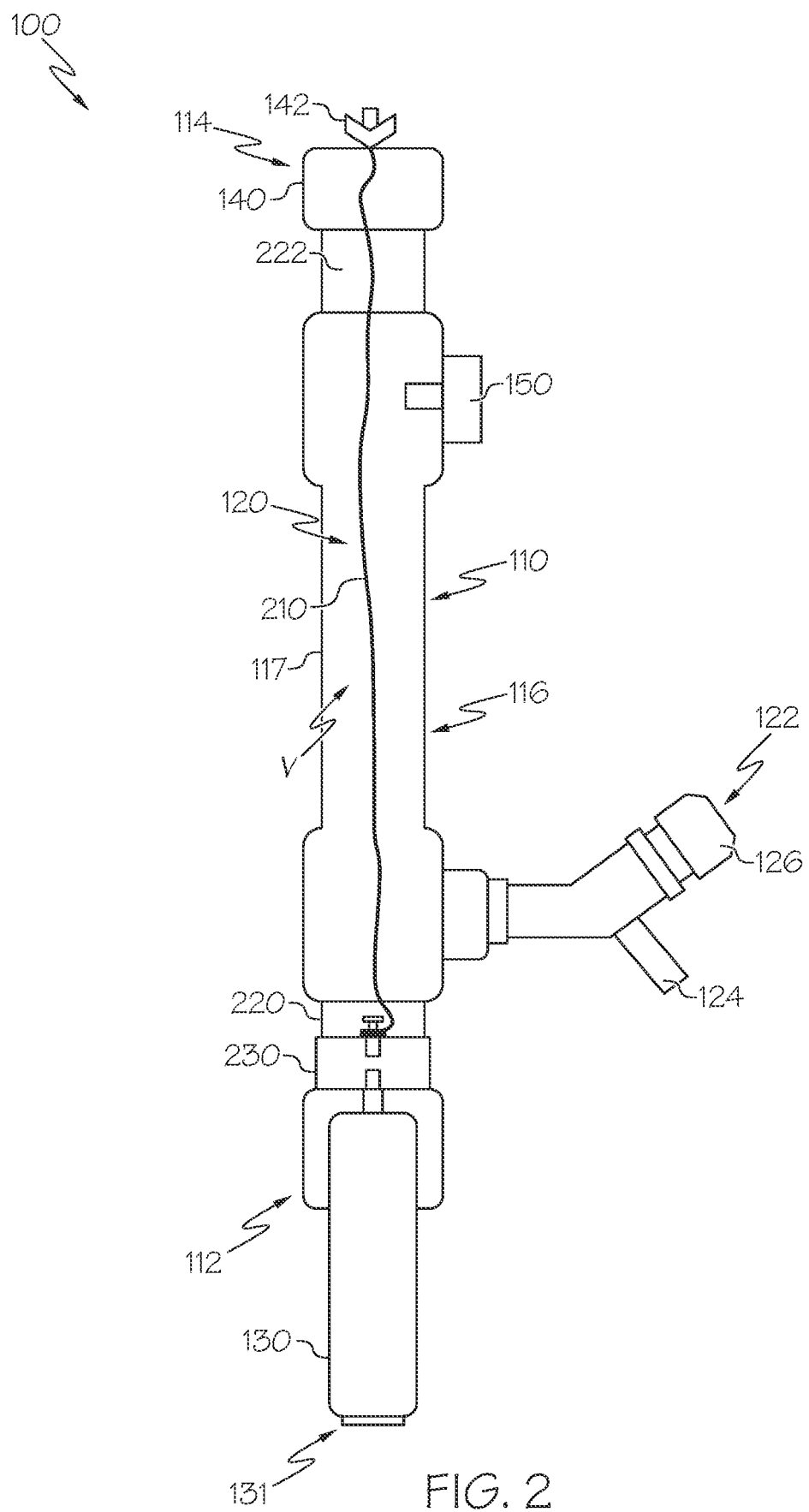
FIG. 2 schematically depicts a sectional view of the reference electrode assembly of FIG. 1, according to one or more embodiments described herein.
Figure 3:
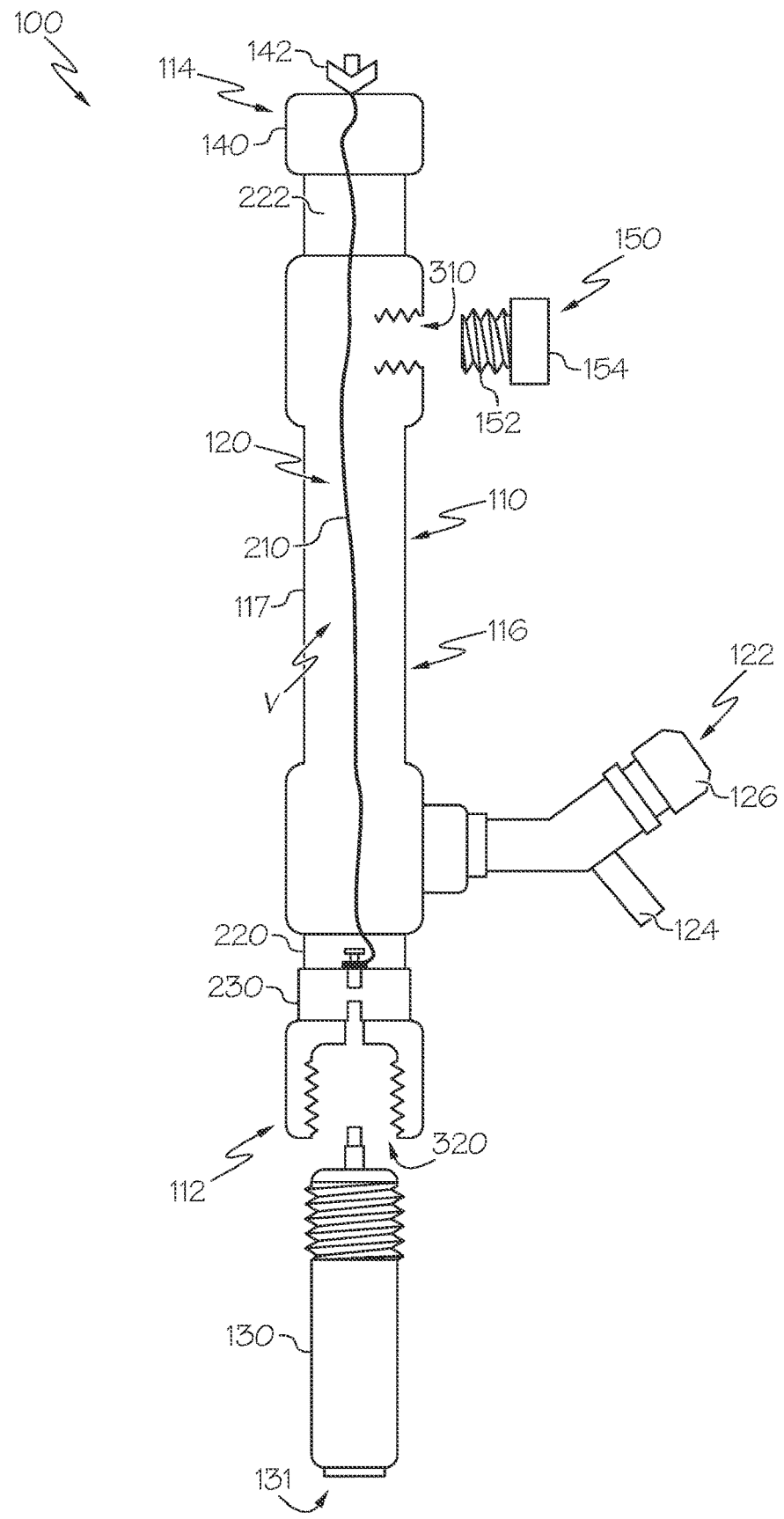
FIG. 3 schematically depicts a sectional view of the reference electrode assembly of FIG. 1 partially disassembled, according to one or more embodiments described herein.
Figure 4:
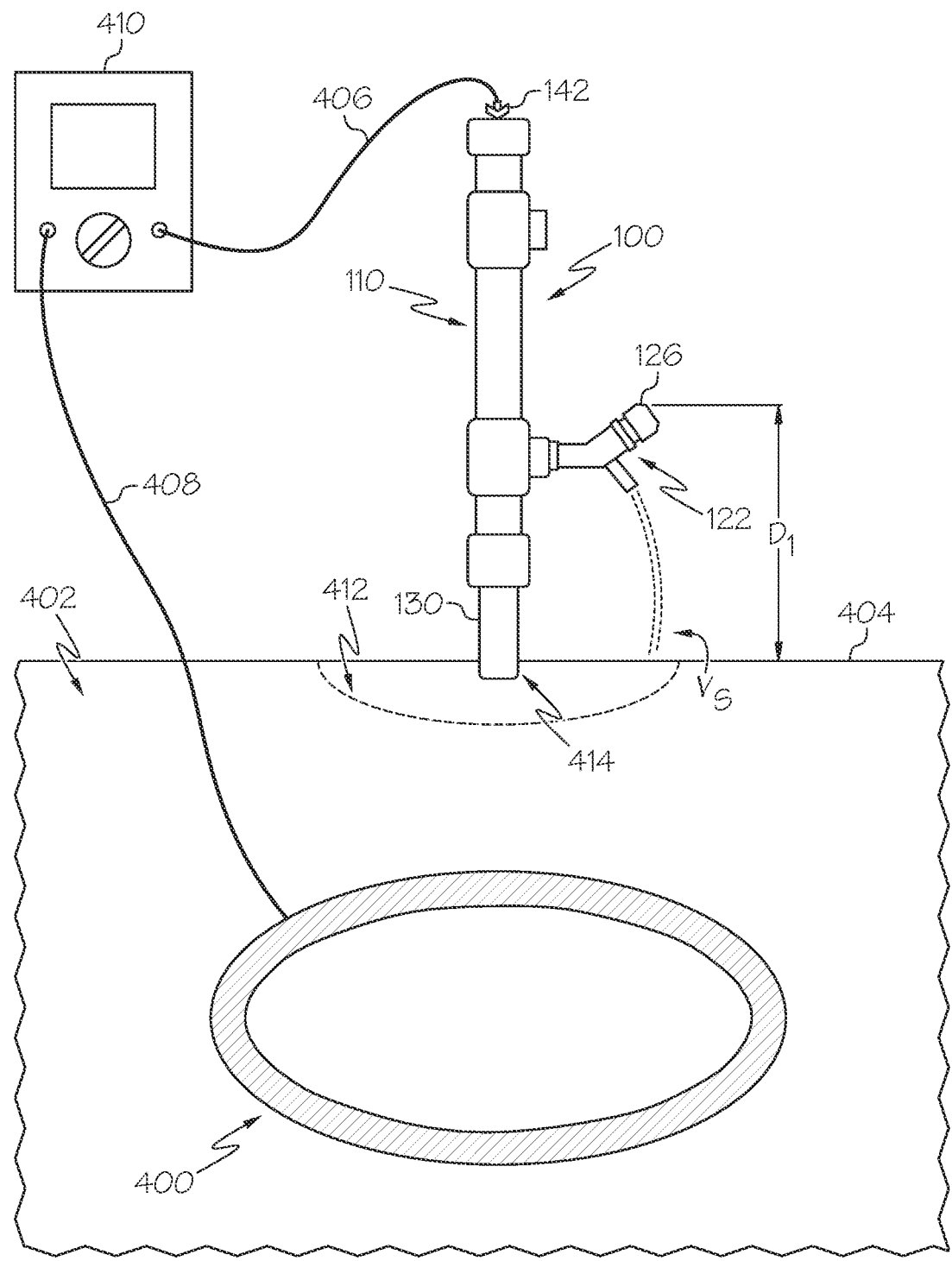
FIG. 4 schematically depicts the reference electrode assembly of FIG. 1 placed in a common electrolyte with a cathodically protected metal structure, according to one or more embodiments described herein.

Referring now to FIGS. 1-3, a reference electrode assembly 100 is depicted, according to an example embodiment. The reference electrode assembly 100 includes a reference electrode 130, which may be used to determine the polarization of a metal structure 400 (FIG. 4). The reference electrode 130 may generally be any electrode that possesses a stable and known electrode potential. The reference electrode 130 may be a piece of metal immersed in a solution of one of its salts. The reference electrode 130 may be any known or commercially available reference electrode. For instance, in embodiments, the reference electrode 130 may be a Cu/CuSO$_4$ reference electrode or an Ag/AgCl reference electrode.

The reference electrode assembly 100 further includes an extension device 110. The extension device 110 includes a first end 112 opposite a second end 114. The extension device 110 includes a body 116 having an outer surface 117 and an at least partially hollow interior. The body 116 of the extension device 110 may consist of plastic, polymer, ceramic, and/or like materials. In some embodiments, the body 116 of the extension device 110 may be polyvinyl chloride. The body 116 of the extension device 110 may generally be any electrically insulating material. The extension device 110 may take any desirable size or shape. For instance, the extension device 110 may have any cross-sectional shape. The extension device 110 comprises a length $L_1$ from the first end 112 to the second end 114. The length $L_1$ may be greater than or equal to about 50 cm, greater than or equal to about 60 cm, greater than or equal to about 70 cm, greater than or equal to about 80 cm, greater than or equal to about 90 cm, greater than or equal to about 100 cm, greater than or equal to about 110 cm, greater than or equal to about 120 cm, greater than or equal to about 130 cm, or greater than or equal to about 140 cm, or within any range having any two of these values as endpoints. The length $L_1$ of the extension device 110 may be chosen to satisfy the ergonomic needs of a particular user.

The reference electrode 130 is engageable with the extension device 110 at the first end 112 of the extension device 110. That is, the reference electrode 130 may removably couple with the first end 112 of the extension device 110. The first end 112 of the extension device 110 may include a partial opening 320. The partial opening 320 and the reference electrode 130 may be shaped and/or sized to provide any desirable removable coupling between the reference electrode 130 and the first end 112 of the extension device 110. In some embodiments, the partial opening 320 and the reference electrode 130 may be configured to provide a snap-fit coupling between the reference electrode 130 and the partial opening 320. In some embodiments, the partial opening 320 and the reference electrode 130 may be configured to threadably couple. For example, the partial opening 320 may include female threads configured to mate with male threads of the reference electrode 130. With the reference electrode 130 coupled to the first end 112 of the extension device, the reference electrode assembly 100 comprises a length $L_2$ from a distal end 131 of the reference electrode 130 to the second end 114 of the extension device 110. The length $L_2$ may be greater than or equal to about 70 cm, greater than or equal to about 80 cm, greater than or equal to about 90 cm, greater than or equal to about 100 cm, greater than or equal to about 110 cm, greater than or equal to about 120 cm, greater than or equal to about 130 cm, greater than or equal to about 140 cm, greater than or equal to about 150 cm, or greater than or equal to about 160 cm, or within any range having any two of these values as endpoints. The length $L_2$ of the reference electrode assembly 100 may be particularly chosen to satisfy the ergonomic needs of a particular user.

The second end 114 of the extension device 110 includes an end cap 140. The end cap 140 includes an external electrical connector 142. The external electrical connector 142 may be made of any desirable electrically conductive material. The external electrical connector 142 may be sized and/or shaped to provide attachment for a first test lead wire 406 (FIG. 4) of a voltmeter 410 (FIG. 4). For instance, the external electrical connector 142 may be sized and/or shaped to receive an alligator clip of the first test lead wire 406 (FIG. 4). In some embodiments, the external electrical connector 142 may be a screw, bolt, wingnut, and/or the like.

The extension device 110 further includes a fluid reservoir 120 disposed between the first end 112 and the second end 114 of the extension device 110. In other words, the fluid reservoir 120 is disposed between the reference electrode 130, when engaged with the first end 112 of the extension device 110, and the external electrical connector 142 of the extension device 110. The fluid reservoir 120 is an at least partially hollow portion of the extension device 110 housed within the outer surface 117 of the body 116 of the extension device 110 and comprises a volume V for holding a volume V of fluid. The volume V of the fluid reservoir 120 may be greater than or equal to about 0.1 L, greater than or equal to about 0.2 L, greater than or equal to about 0.3 L, greater than or equal to about 0.4 L, greater than or equal to about 0.5 L, greater than or equal to about 0.6 L, greater than or equal to about 0.7 L, greater than or equal to about 0.8 L, greater than or equal to about 0.9 L, or greater than or equal to about 1.0 L, or within any range comprising any two of these values as endpoints.

The fluid reservoir 120 further includes an opening 310 fluidly coupled to the fluid reservoir 120. The opening 310 extends from the fluid reservoir 120 through the outer surface 117 of the body 116 of the extension device 110. The perimeter of the opening 310 in the outer surface 117 of the body 116 of the extension device 110 may take any desirable size or shape. Similarly, the surface area of the opening 310 in the outer surface 117 of the body 116 of the extension device 110 may take any desirable size. The extension device 110 further includes a plug 150 engageable with the opening 310. The plug 150 is sized to fit within the opening 310. The plug 150 at least partially seals the opening 310 in the fluid reservoir 120 and the outer surface 117 of the body 116 of the extension device 110. In some embodiments, the plug 150 may be press-fit in the opening 310. In some embodiments, the plug 150 may be threadably engageable with the opening 310. That is, the opening 310 may include female threads, and the plug 150 may include male threads engageable with the female threads of the opening 310. In embodiments, the plug 150 may include a stem portion 152 that is received within the opening 310 and a head portion 154 that extends from the outer surface 117 of the body 116 of the extension device 110 when the plug 150 is engaged with the opening 310 to at least partially seal the fluid reservoir 120. The head portion 154 may be actuated by a user to insert or remove the plug 150 from the opening 310.

The extension device 110 further includes a selectively actuatable spout 122. The selectively actuatable spout 122 is disposed between the first end 112 of the extension device 110 and the opening 310 of the fluid reservoir 120, and the opening 310 of the fluid reservoir 120 is disposed between the selectively actuatable spout 122 and the second end 114 of the extension device 110. The selectively actuatable spout 122 is fluidly coupled with the fluid reservoir 120 of the extension device 110. The selectively actuatable spout 122 includes a spout head 124 that extends from the outer surface 117 of the body 116 of the extension device 110. The spout 122 further includes a spout actuator 126. The spout actuator 126 may be a valve having an actuatable lever, arm, dial, wheel, push-button, and/or the like. Accordingly, by selectively turning, spinning, pressing, and/or otherwise actuating the spout actuator 126, a user can selectively direct or release fluid from the fluid reservoir 120 through the spout head 124. Similarly, by selectively turning, spinning, releasing pressure from, or otherwise actuating the spout actuator 126, a user can shut the valve of the spout actuator 126 such that fluid is not released from the fluid reservoir 120 through the spout head 124. The selectively actuatable spout 122, and more specifically, the spout actuator 126, may be disposed on the extension device 110 at an ergonomically selected distance from the first end 112 of the extension device 110.

The extension device 110 further includes a conductive fitting 230. The conductive fitting 230 may include any conductive material. For instance, the conductive fitting 230 may be a metal or metal alloy. The conductive fitting 230 may be housed within the outer surface 117 of the body 116 of the extension device 110. The conductive fitting 230 may be disposed between the first end 112 of the extension device 110 and the fluid reservoir 120. In other words, the conductive fitting 230 may be disposed between the reference electrode 130, when the reference electrode 130 is engaged with the first end 112 of the extension device 110, and the fluid reservoir 120. When the reference electrode 130 is engaged with the first end 112 of the extension device 110, the conductive fitting 230 at least partially contacts a portion of the reference electrode 130, such that the reference electrode 130 is electrically coupled to the conductive fitting 230.

The extension device 110 further includes a first sealant 220. The first sealant 220 may be any material configured to at least partially seal, or prevent the passage of fluids through, an opening. For instance, the first sealant 220 may be a polymer or plastic. In some embodiments, the first sealant 220 may be silicone. The first sealant 220 may be housed within the outer surface 117 of the body 116 of the extension device 110. The first sealant 220 is disposed between the conductive fitting 230 and the fluid reservoir 120. The first sealant 220 at least partially seals the fluid reservoir 120 at the end of the fluid reservoir 120 proximal the first end 112 of the extension device 110, isolating the conductive fitting 230 and the reference electrode 130 from the fluid reservoir 120, and more particularly from the fluid contained in the fluid reservoir 120.

The extension device 110 further includes a second sealant 222. The second sealant 222 may be any material configured to at least partially seal, or prevent the passage of fluids through, an opening. For instance, the second sealant 222 may be a polymer or plastic, such as silicone. In some embodiments, the first sealant 220 and the second sealant 222 may be the same material. The second sealant 222 may be housed within the outer surface 117 of the body 116 of the extension device 110. The second sealant 222 is disposed between the end cap 140 and the fluid reservoir 120. Therefore, the second sealant 222 is disposed between the external electrical connector 142 and the fluid reservoir 120. The second sealant 222 at least partially seals the fluid reservoir 120 at the end of the fluid reservoir 120 proximal the second end 114 of the extension device 110, isolating the end cap 140 and the external electrical connector 142 from the fluid reservoir 120, and more particularly from the fluid contained in the fluid reservoir 120.

The extension device 110 further includes a conductive wire 210. The conductive wire 210 may include any desirable conductive material. As a non-limiting example, the conductive wire 210 may include aluminium, copper, steel, and/or a metal alloy. The conductive wire 210 may be coated in an insulating material, such as a plastic, polymer, rubber, and/or the like. The conductive wire 210 is housed within the outer surface 117 of the body 116 of the extension device 110. The conductive wire 210 extends through the fluid reservoir 120 of the extension device 110. The conductive wire 210 is configured to electrically couple the reference electrode 130, when the reference electrode 130 is engaged with the first end 112 of the extension device 110, with the external electrical connector 142. More particularly, the conductive wire 210 extends through the fluid reservoir 120 and at least partially through the first sealant 220 such that the conductive wire 210 is electrically coupled to the conductive fitting 230. Accordingly, the conductive wire 210 electrically couples to the reference electrode 130 through the conductive fitting 230. The conductive wire 210 further at least partially extends through the second sealant 222 and the end cap 140 such that the conductive wire 210 is electrically coupled to the external electrical connector 142. Accordingly, the conductive wire 210 electrically couples the reference electrode 130 with the external electrical connector 142.

With reference to FIGS. 1-4, a method of operating the reference electrode assembly 100 will now be discussed. Prior to bringing the reference electrode assembly 100 to one or more test sites along a cathodically protected metal structure, the fluid reservoir 120 of the extension device 110 may be filled with water or any other suitable liquid electrolyte, for example, by a technician or an automated system. More specifically, the plug 150 may be removed from the opening 310 of the fluid reservoir 120 to fill the fluid reservoir 120 with a first volume of fluid. Once the fluid reservoir 120 is filled with fluid, the plug 150 is inserted into the opening 310 to at least partially seal the fluid reservoir 120. The reference electrode assembly 100, including the reference electrode 130 engaged with the extension device 110, may then be transported to a test site. The test site may be any point along a cathodically protected metal structure 400 positioned at least partially within a subsurface 402 and/or in contact with a ground surface 404. That is, in embodiments, the metal structure 400 may be entirely located beneath the ground surface 404, the metal structure may be partially located beneath the ground surface 404, and/or the metal structure may be located above and in contact with the ground surface 404. The subsurface 402 and ground surface 404 may be any combination of soil, sand, clay, rock and/or the like. One example metal structure 400 is a pipeline, such as a pipeline for transporting one or more liquids. Another example metal structure 400 is a storage device. In general, the metal structure 400 may be any metal structure being protected by passive or impressed current cathodic protection systems and thus configured to behave as a cathode in an electrochemical cell. Therefore, the metal structure 400 is any structure placed in a common electrolyte (such as the subsurface 402 and/or ground surface 404) with an anode and configured to receive a flow of electrons from the anode.

Once at a desired test site, the reference electrode 130 of the reference electrode assembly 100 may be placed in contact with the ground surface 404 and/or subsurface 402 at the test site, for example, contacted or at least partially inserted into the subsurface 402, beneath the ground surface 404. Because the reference electrode 130 is engaged with the extension device 110, which has the length $L_1$, when a technician is contacting the reference electrode 130 with the ground surface 404 and/or subsurface 402, the technician may maintain the reference electrode 130 in a desired position in relation to the ground surface 404 and/or subsurface 402 without needing to bend over. In other words, the technician may position the reference electrode 130 by handling the extension device 110 engaged with the reference electrode 130. It should be appreciated that the length $L_1$ of the extension device 110 and the length $L_2$ of the reference electrode assembly 100 may be particularly selected for an individual technician based on the technician's height. That is, the length $L_1$ of the extension device 110 and/or the length $L_2$ of the reference electrode assembly 100 may be selected to increase ergonomics for a particular technician expected to handle the reference electrode assembly 100 in order to minimize or eliminate the need for the technician to bend over during the cathodic protection testing procedure. As a non-limiting example, the length $L_1$ of the extension device 110 and/or the length $L_2$ of the reference electrode assembly 100 may be selected such that the second end 114 of the extension device 110, when the reference electrode 130 is coupled to the extension device 110 and located in the ground surface 404 and/or subsurface 402, extends to a technician's chest. Therefore, the technician may be able to manipulate the extension device 110 and reference electrode 130 without bending toward the ground surface 404.

Next, the method includes actuating the spout actuator 126 of the spout 122 to direct an amount of fluid from the fluid reservoir 120 to the ground surface 404 at the test site. The amount of fluid directed from the fluid reservoir 120 to the ground surface 404 may be a sub-volume $V_s$ of the first volume of fluid used to fill the fluid reservoir 120. The amount of fluid directed from the fluid reservoir 120 to the ground surface 404 may wet the ground surface 404 surrounding the reference electrode 130 when the reference electrode 130 is desirably positioned at the test site. The amount of fluid directed from the fluid reservoir 120 to the ground surface 404 may further wet the subsurface 402 surrounding the reference electrode 130 when the reference electrode 130 is desirably positioned at the test site. That is, the amount of fluid directed from the fluid reservoir 120 to the ground surface 404 may result in a wet region 412 around a contact point 414 of the reference electrode 130 with the ground surface 404. In operation, the wet region 412 around the contact point 414 reduces the contact resistance between the reference electrode 130 and the ground surface 404 and/or subsurface 402 surrounding the reference electrode 130.

Once a desirable amount of fluid from the fluid reservoir 120 is directed toward the ground surface 404, the spout actuator 126 of the spout 122 may be actuated to shut a valve of the spout actuator 126 such that fluid is not further released from the fluid reservoir 120 through the spout 122. The spout 122, and more specifically, the spout actuator 126 may be located along the extension device 110 such that when the reference electrode 130 of the reference electrode assembly 100 is desirably placed with respect to the ground surface 404 at the test site, the spout actuator 126 is positioned a distance $D_1$ from the ground surface 404. The distance $D_1$ may be selected such that a technician may actuate the spout actuator 126 with his or her foot. That is, the distance $D_1$ may be selected to ergonomically benefit the technician. The distance $D_1$ may be selected not only to enable a technician to actuate the spout actuator 126 by foot (i.e. to eliminate the need for the technician to bend over to actuate the spout actuator 126 by hand), but also to allow the technician to actuate the spout actuator 126 by foot without lifting his or her foot an ergonomically difficult or taxing distance from the ground surface 404.

The method further comprises electrically coupling the reference electrode 130 and a first portion of the metal structure 400 at the test site to the voltmeter 410 to measure the difference in potential between the first portion of the metal structure 400 and the subsurface 402 and/or ground surface 404 surrounding the first portion of the metal structure 400. The voltmeter 410 may be a high input impedance voltmeter. The first test lead wire 406 may connect the reference electrode 130 to a first terminal of the voltmeter 410. More particularly, the first test lead wire 406 may attach to the external electrical connector 142 of the extension device 110. Therefore the first test lead wire 406 electrically couples to the reference electrode 130 via the external electrical connector 142, the conductive wire 210, and the conductive fitting 230. A second test lead wire 408 may connect the first portion of the metal structure 400 to a second terminal of the voltmeter 410. In embodiments, the second test lead wire 408 may attach to a test cable coupled to the first portion of the metal structure 400 and extending from the ground surface 404 at a designated test location. That is, the second test lead wire 408 may electrically couple to the first portion of the metal structure 400 via the test cable. It should be appreciated that in some embodiments, the first test lead wire 406, electrically coupled to the reference electrode 130, may connect to the positive terminal of the voltmeter 410, and the second test lead wire 408, electrically coupled to the first portion of the metal structure 400, may connect to the negative terminal of the voltmeter 410. In other embodiments, the first test lead wire 406, electrically coupled to the reference electrode 130, may connect to the negative terminal of the voltmeter 410, and the second test lead wire 408, electrically coupled to the first portion of the metal structure 400, may connect to the positive terminal of the voltmeter 410.

With the reference electrode 130 and metal structure 400 in contact with a common electrolyte (i.e. the subsurface 402 and/or ground surface 404) and the reference electrode 130 and metal structure 400 electrically coupled to the voltmeter 410, a circuit is formed that allows the determination of the potential difference between the first portion of the metal structure 400 and the subsurface 402 and/or ground surface 404 surrounding the first portion of the metal structure 400. Because the reference electrode 130 possesses a stable and known potential, the polarization of the first portion of the metal structure 400, or the potential difference between the first portion of the metal structure 400 and the subsurface 402 and/or ground surface 404 surrounding the first portion of the metal structure 400 may be determined. Therefore, based on the readout from the voltmeter 410, the polarization of the first portion of the metal structure 400 may be determined. The polarization of the first portion of the metal structure 400 may be further analyzed to determine if the cathodic protection system is adequately operating or if there is a fault in the system. More specifically, based on the material of the metal structure 400, the desired lifetime of the metal structure 400, the desired equilibrium between the cathodic and anodic reactions of the cathodic protection system, the type of cathodic protection system (i.e. passive or impressed current), the material of the anode of the protection system, and additional factors, it may be desirable for the metal structure 400 to display a polarization within a set range of values. If the polarization of the metal structure 400 is outside this desired range, the metal structure 400 may be over or under protected (i.e. over or under polarized), indicating a fault in the cathodic protection system, which a technician or automated system may then identify and rectify.

Once the polarization of the first portion of the metal structure 400 is determined at a first test site along the metal structure 400, the reference electrode assembly 100 may be moved to a second test site along the metal structure 400 to determine the polarization of a second portion of the metal structure 400 at the second test site. The second test site location may be any desirable distance from the first test site. In embodiments, the second test site may be 80-100 m from the first test site. After the polarization of the first portion of the metal structure 400 is determined at the first test site, the reference electrode 130 may be removed from the ground surface 404 and/or subsurface 402 at the first test site. More specifically, because the reference electrode 130 is coupled to the extension device 110, and due to the length $L_1$ of the extension device 110 and length $L_2$ of the reference electrode assembly 100, a technician may remove the reference electrode 130 from the ground surface 404 and/or subsurface 402 at the first test site by maneuvering the extension device 110. In other words, the technician does not need to bend over to reach and remove the reference electrode 130 from the ground surface 404 and/or subsurface 402 at the first test site. At least the second test lead wire 408 may be decoupled from the first portion of the metal structure 400 at the first test site to move the voltmeter 410, in addition to the reference electrode assembly 100, to the second test site. Once the reference electrode assembly 100 is brought to the second test site, the substantially same steps as discussed above with respect to the first test site may be taken to determine the polarization of a second portion of the metal structure 400 at the second test site. That is, the reference electrode 130 of the reference electrode assembly 100 may be contacted with the ground surface 404 and/or subsurface 402 at a contact point 414 at the second test site. The spout actuator 126 may be actuated to direct a second sub-volume of fluid $V_s$ of the first volume of fluid used to fill the fluid reservoir 120 from the fluid reservoir 120 through the spout 122 to the ground surface 404 at the second test site. The amount of fluid directed from the fluid reservoir 120 to the ground surface 404 may wet the ground surface 404 and/or the subsurface 402 surrounding the reference electrode 130 at the contact point 414 at the second test site. That is, the amount of fluid directed from the fluid reservoir 120 to the ground surface 404 may result in a wet region 412 around a contact point 414 of the reference electrode 130 with the ground surface 404. Once a desirable amount of fluid from the fluid reservoir 120 is directed toward the ground surface 404, the spout actuator 126 of the spout 122 may be actuated to shut a valve of the spout actuator 126 such that fluid is not further released from the fluid reservoir 120 through the spout 122.

The reference electrode assembly 100 may further be operated at the second test site in a similar fashion as at the first test site to determine the polarization of the second portion of the metal structure 400 at the second test site. That is, the reference electrode 130 may be electrically coupled to the voltmeter 410 with the first test lead wire 406, which attaches to the external electrical connector 142 of the extension device 110. The second portion of the metal structure 400 at the second test site may be electrically coupled to the voltmeter 410 with the second test lead wire 408. With the reference electrode 130 and metal structure 400 in contact with a common electrolyte (i.e. the subsurface 402 and/or ground surface 404) and the reference electrode 130 and metal structure 400 electrically coupled to the voltmeter 410, a circuit is formed that allows the determination of the difference in potential between the second portion of the metal structure 400 and the subsurface 402 and/or ground surface 404 surrounding the second portion of the metal structure 400 at the second test site. Accordingly, the polarization of the second portion of the metal structure 400 at the second test site may be determined, and a technician or automated system may further determine if the cathodic protection system is adequately operating or if there is a fault in the system.

The reference electrode assembly 100 may similarly be moved from the second test site to any number of additional test sites along the metal structure 400 to determine the polarization of the metal structure 400 at each of the test sites. A sub-volume $V_s$ of the first volume of fluid used to fill the fluid reservoir 120 may be released from the fluid reservoir 120 through the spout 122 to the ground surface 404 at each of the test sites. The first volume of fluid used to fill the fluid reservoir 120 may provide enough fluid to generate the wet region 412 around the contact point 414 at roughly 30-40 different test sites. The first volume of fluid used to fill the fluid reservoir 120 may provide enough fluid to generate the wet region 412 around the contact point 414 at a plurality of test sites, where the plurality of test sites span a distance of roughly 3 km along a length of the metal structure 400. The technician may refill the fluid reservoir 120 with fluid before or after the fluid reservoir 120 is drained of fluid.

It should be appreciated that the method of determining the polarization of the metal structure 400 at each test site discussed above is not limited to the specific order of steps presented. Similarly, it should be appreciated that one or more steps may be consolidated or performed simultaneously, omitted, or additionally added. Accordingly, the method is not limited to the exact number and order of steps presented.

In view of the foregoing description, it should be understood that the polarization of a metal structure protected by a cathodic protection system may be efficiently and accurately determined by use of a reference electrode assembly including an extension device, having a fluid reservoir, and a reference electrode. It should also be understood that the reference electrode assembly may provide improved ergonomics to technicians conducting the cathodic protection testing. Beneficially, the reference electrode assemblies described herein reduce the number of items a technician must carry to multiple test sites, increase testing efficiency, and reduce risk of injury to technicians. Moreover, the reference electrode assembly may increase the efficiency of testing of cathodic protection systems, increasing productivity and providing cost savings.

As used herein, the terms "about" and "roughly" mean that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" or "roughly" is used in describing a value or an end-point of a range, the specific value or end-point referred to is included. Whether or not a numerical value or end-point of a range in the specification recites "about" or "roughly," two embodiments are described: one modified by "about" or "roughly," and one not modified by "about" or "roughly." It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation; and, the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

It is noted that recitations herein of a component of the present disclosure being "configured" or "programmed" in a particular way, to embody a particular property, or function in a particular manner, are structural recitations, as opposed to recitations of intended use. More specifically, the references herein to the manner in which a component is "programmed" or "configured" denotes an existing physical condition of the component and, as such, is to be taken as a definite recitation of the structural characteristics of the component.

It is noted that terms like "preferable," "typical," and "suitable" when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Further, it will be apparent that modifications and variations are possible without departing from the scope of the present disclosure, including, but not limited to, embodiments defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method comprising:
    contacting at least a portion of a reference electrode of a reference electrode assembly with a ground surface at a test site, wherein the reference electrode assembly comprises:
        an extension device comprising a first end opposite a second end, wherein the first end is engageable with the reference electrode and a fluid reservoir is disposed between the first end and the second end;
        an end cap having an external electrical connector positioned at the second end of the extension device;
        a selectively actuatable spout fluidly coupled to the fluid reservoir; and
        a conductive wire extending through the fluid reservoir to electrically couple the reference electrode with the external electrical connector;
    actuating the selectively actuatable spout to direct an amount of fluid from the fluid reservoir to the ground surface at the test site;
    electrically coupling the reference electrode to a first terminal of a voltmeter;
    electrically coupling a first portion of a metal structure to a second terminal of the voltmeter;
    determining the polarization of the first portion of the metal structure;
    removing the reference electrode assembly from the ground surface at the test site;
    contacting at least a portion of the reference electrode of the reference electrode assembly with the ground surface at a second test site;
    actuating the selectively actuatable spout to direct a second amount of fluid from the fluid reservoir to the ground surface at the second test site;
    electrically coupling the reference electrode to the first terminal of the voltmeter;
    electrically coupling a second portion of the metal structure to the second terminal of the voltmeter; and
    determining the polarization of the second portion of the metal structure.

2. The method of claim 1, wherein the first portion of the metal structure is at least partially positioned in a subsurface at the test site.

3. The method of claim 1, wherein electrically coupling the reference electrode to the first terminal of the voltmeter comprises coupling a test lead of the voltmeter to the external electrical connector of the end cap.

4. A method comprising:
    contacting at least a portion of a reference electrode of a reference electrode assembly with a ground surface at a test site, wherein the reference electrode assembly comprises:
        an extension device comprising a first end opposite a second end, wherein the first end is engageable with the reference electrode and a fluid reservoir is disposed between the first end and the second end;
        an end cap having an external electrical connector positioned at the second end of the extension device;
        a selectively actuatable spout fluidly coupled to the fluid reservoir; and
        a conductive wire extending through the fluid reservoir to electrically couple the reference electrode with the external electrical connector;
    actuating the selectively actuatable spout to direct an amount of fluid from the fluid reservoir to the ground surface at the test site;
    electrically coupling the reference electrode to a first terminal of a voltmeter;
    electrically coupling a first portion of a metal structure to a second terminal of the voltmeter;
    filling the fluid reservoir with a first volume of fluid;

contacting at least a portion of the reference electrode of the reference electrode assembly with the ground surface at a plurality of test sites;

actuating the selectively actuatable spout to direct a sub-volume of the first volume of fluid from the fluid reservoir to the ground surface at each of the plurality of test sites; and determining the polarization of the metal structure at each of the plurality of test sites.

5. A reference electrode assembly, comprising:

an extension device comprising a first end opposite a second end and a fluid reservoir disposed between the first end and the second end;

a reference electrode engageable with the extension device at the first end of the extension device;

an end cap having an external electrical connector positioned at the second end of the extension device;

a selectively actuatable spout fluidly coupled to the fluid reservoir;

an opening in an outer surface of the extension device disposed between the selectively actuatable spout and the second end of the extension device, wherein:
the opening is fluidly coupled to the fluid reservoir; and
a plug is engageable with the opening;

a conductive fitting disposed between the reference electrode and the fluid reservoir;

a first sealant disposed between the conductive fitting and the fluid reservoir;

a second sealant disposed between the end cap and the fluid reservoir; and a conductive wire extending through the fluid reservoir and at least partially through the first and second sealants to electrically couple the reference electrode with the external electrical connector.

* * * * *